United States Patent
Sankaranarayanan et al.

(10) Patent No.: US 10,298,263 B2
(45) Date of Patent: May 21, 2019

(54) REFRESH, RUN, AGGREGATE DECODER RECOVERY

(71) Applicant: Seagate Technology, LLC, Cupertino, CA (US)

(72) Inventors: Sundararajan Sankaranarayanan, San Jose, CA (US); AbdelHakim S. Alhussien, Milpitas, CA (US); Erich F. Haratsch, San Jose, CA (US); Earl Cohen, Milpitas, CA (US)

(73) Assignee: SEAGATE TECHNOLOGY LLC, Cupertino, CA (US)

( * ) Notice: Subject to any disclaimer, the term of this patent is extended or adjusted under 35 U.S.C. 154(b) by 207 days.

(21) Appl. No.: 14/218,626

(22) Filed: Mar. 18, 2014

(65) Prior Publication Data

US 2015/0236726 A1   Aug. 20, 2015

Related U.S. Application Data

(60) Provisional application No. 61/941,378, filed on Feb. 18, 2014.

(51) Int. Cl.
*H03M 13/11* (2006.01)
*H03M 13/00* (2006.01)
*H03M 13/37* (2006.01)
*H03M 13/45* (2006.01)

(52) U.S. Cl.
CPC .... *H03M 13/1111* (2013.01); *H03M 13/1142* (2013.01); *H03M 13/3723* (2013.01)

(58) Field of Classification Search
None
See application file for complete search history.

(56) References Cited

U.S. PATENT DOCUMENTS

| | | | |
|---|---|---|---|
| 8,213,255 B2 * | 7/2012 | Hemink | G11C 7/04 365/185.18 |
| 9,059,742 B1 * | 6/2015 | Anderson | H03M 13/1111 |
| 9,128,858 B1 * | 9/2015 | Micheloni | G06F 11/10 |
| 2006/0107179 A1 * | 5/2006 | Shen | H03M 13/1111 714/758 |
| 2011/0205823 A1 * | 8/2011 | Hemink | G11C 7/04 365/211 |

OTHER PUBLICATIONS

Varnica, Ned, LDPC Decoding: VLSI Architectures and Implementations, Module 1: LDPC Decoding, Aug. 14, 2013, https://www.flashmemorysummit.com/English/Collaterals/Proceedings/2013/20130814_LDPC_Tutorial_Mod1.pdf.*

* cited by examiner

*Primary Examiner* — Justin R Knapp
(74) *Attorney, Agent, or Firm* — Holland & Hart LLP

(57) ABSTRACT

A data processing system includes a likelihood input operable to receive encoded data, a decoder operable to apply a decoding algorithm to likelihood values for the received encoded data and to yield a decoded output, and a decoder input initialization circuit operable to generate new decoder input values based in part on the likelihood values for the received encoded data after the likelihood values for the received encoded data have failed to converge in the decoder.

8 Claims, 7 Drawing Sheets

US 10,298,263 B2

REFRESH, RUN, AGGREGATE DECODER RECOVERY

FIELD OF THE INVENTION

Various embodiments of the present invention provide systems and methods for error recovery in a decoder including refreshing the decoder input and rerunning

BACKGROUND

Various data processing systems have been developed including storage systems, cellular telephone systems, and radio transmission systems. In such systems data is transferred from a sender to a receiver via some medium. For example, in a storage system, data is sent from a sender (i.e., a write function) to a receiver (i.e., a read function) via a storage medium. As information is stored and transmitted in the form of digital data, errors can be introduced that, if not corrected, can corrupt the data and render the information unusable. The effectiveness of any transfer is impacted by any losses in data caused by various factors. Many types of error checking systems have been developed to detect and correct errors in digital data. For example, parity bits can be added to groups of data bits, ensuring that the groups of data bits (including the parity bits) have either even or odd numbers of ones. The parity bits may be used in error correction systems, including in Low Density Parity Check (LDPC) decoders. When errors are not corrected with normal error correction procedures, recovery features may be needed to correct stubborn errors.

SUMMARY

Various embodiments of the present invention provide systems and methods for error recovery in a decoder including refreshing the decoder input and rerunning In some embodiments, a data processing system includes a likelihood input operable to receive encoded data, a decoder operable to apply a decoding algorithm to likelihood values for the received encoded data and to yield a decoded output, and a decoder input initialization circuit operable to generate new decoder input values based in part on the likelihood values for the received encoded data after the likelihood values for the received encoded data have failed to converge in the decoder.

This summary provides only a general outline of some embodiments of the invention. The phrases "in one embodiment," "according to one embodiment," "in various embodiments", "in one or more embodiments", "in particular embodiments" and the like generally mean the particular feature, structure, or characteristic following the phrase is included in at least one embodiment of the present invention, and may be included in more than one embodiment of the present invention. Importantly, such phrases do not necessarily refer to the same embodiment. This summary provides only a general outline of some embodiments of the invention. Additional embodiments are disclosed in the following detailed description, the appended claims and the accompanying drawings.

BRIEF DESCRIPTION OF THE FIGURES

A further understanding of the various embodiments of the present invention may be realized by reference to the figures which are described in remaining portions of the specification. In the figures, like reference numerals may be used throughout several drawings to refer to similar components. In the figures, like reference numerals are used throughout several figures to refer to similar components.

DETAILED DESCRIPTION OF THE INVENTION

Embodiments of the present invention are related to decoder error recovery, wherein after an initial decoding operation fails to correctly decode encoded data, one or more subsequent decoding runs are performed. If the decoder does not converge during the initial decoding operation, the decoder input is refreshed or initialized to a different initial state and at least one additional decoding run is performed. In some embodiments, multiple decoding runs are performed and the output of each run is aggregated with the aggregate used to generate a new initial decoder input. The refresh, run, aggregate recovery disclosed herein can be used with any suitable decoder, including, but not limited to, message-passing decoders such as low density parity check decoders.

Error floor is a phenomenon that stems from the interaction of the low density parity check code graph and the message passing decoder. Error floor is an abrupt drop in slope in the uncorrectable bit error rate (UBER) curve or codeword failure rate (CWER) curve at medium-high and high signal to noise ratios (SNR). Such a change in slope can be attributed to trapping sets in the low density parity check code graph and the underlying decoder algorithm which result in an abrupt flattening in the uncorrectable bit error rate curve.

Such an abrupt flattening in the uncorrectable bit error rate curve is undesirable, particularly in flash memory systems designed to achieve an uncorrectable bit error rate as low as $1e^{-16}$. Each time data from a memory or transmission system fails to converge in a decoder, a recovery procedure is triggered, which can include soft reads, additional decoding iterations, etc., designed and ordered to effect decoder convergence with minimum latency. A high error floor results in frequent triggering of the recovery procedure which adds to the latency of the data processing system and is therefore undesirable. The refresh, run, aggregate decoder recovery disclosed herein addresses issues arising from trapping sets and reduces latency and enhances performance of the overall data processing system.

Decoder technology is applicable to transmission of information over virtually any channel or storage of information on virtually any media. Transmission applications include, but are not limited to, optical fiber, radio frequency channels, wired or wireless local area networks, digital subscriber line technologies, wireless cellular, Ethernet over any medium such as copper or optical fiber, cable channels such as cable television, and Earth-satellite communications. Storage applications include, but are not limited to, hard disk drives, compact disks, digital video disks, magnetic tapes and memory devices such as DRAM, NAND flash, NOR flash, other non-volatile memories and solid state drives.

Figure 1:
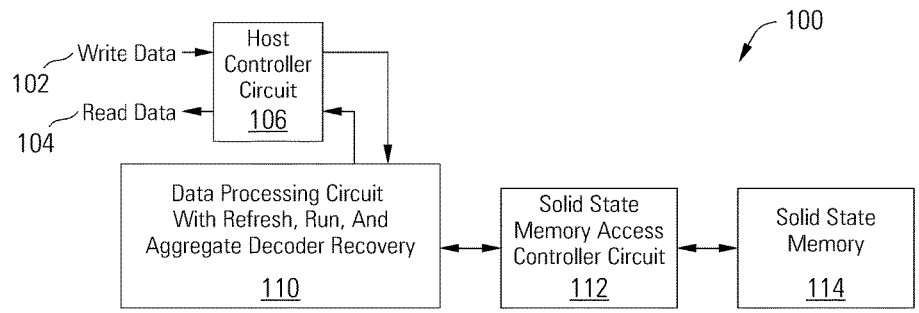
FIG. 1 depicts a solid state storage system including a data processing circuit with refresh, run and aggregate decoder recovery in accordance with some embodiments of the present invention.

Turning to FIG. 1, a solid state storage system 100 is shown that includes a data processing circuit 110 with refresh, run, aggregate decoder recovery in accordance with one or more embodiments of the present invention. A host controller circuit 106 receives data to be stored (i.e., write data 102). This data is provided to data processing circuit 110 where it is encoded using a low density parity check encoder or other suitable encoder. The encoded data is provided to a solid state memory access controller circuit 112. Solid state memory access controller circuit 112 can be any circuit known in the art that is capable of controlling access to and from a solid state memory. Solid state memory access controller circuit 112 formats the received encoded data for transfer to a solid state memory 114. Solid state memory 114 can be any solid state memory known in the art. In some embodiments of the present invention, solid state memory 114 is a flash memory. Later, when the previously written data is to be accessed from solid state memory 114, solid state memory access controller circuit 112 requests the data from solid state memory 114 and provides the requested data to data processing circuit 110. In turn, data processing circuit 110 decodes the data in any suitable detector such as, but not limited to, a low density parity check decoder. If the decoder fails to converge, a refresh, run, aggregate decoder recovery process can be performed by data processing circuit 110 to facilitate convergence. The decoded data is provided to host controller circuit 106 where it is passed on as read data 104.

Figure 2:
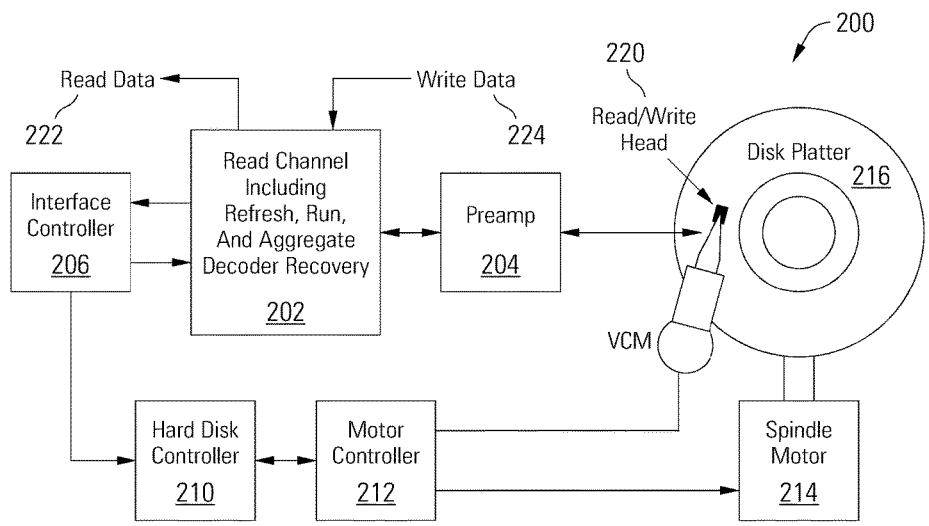
FIG. 2 depicts a wireless communication system including refresh, run and aggregate decoder recovery in accordance with some embodiments of the present invention.

Turning to FIG. 2, a magnetic storage system 200 is disclosed which includes a read channel circuit 202 with refresh, run, aggregate decoder recovery in accordance with some embodiments of the present invention. Storage system 200 may be, for example, a hard disk drive. Storage system 200 also includes a preamplifier 204, an interface controller 206, a hard disk controller 210, a motor controller 212, a spindle motor 214, a disk platter 216, and a read/write head assembly 220. Interface controller 206 controls addressing and timing of data to/from disk platter 216. The data on disk platter 216 consists of groups of magnetic signals that may be detected by read/write head assembly 220 when the assembly is properly positioned over disk platter 216. In one embodiment, disk platter 216 includes magnetic signals recorded in accordance with either a longitudinal or a perpendicular recording scheme.

In a typical read operation, read/write head assembly 220 is accurately positioned by motor controller 212 over a desired data track on disk platter 216. Motor controller 212 both positions read/write head assembly 220 in relation to disk platter 216 and drives spindle motor 214 by moving read/write head assembly 220 to the proper data track on disk platter 216 under the direction of hard disk controller 210. Spindle motor 214 spins disk platter 216 at a determined spin rate (RPMs). Once read/write head assembly 220 is positioned adjacent the proper data track, magnetic signals representing data on disk platter 216 are sensed by read/write head assembly 220 as disk platter 216 is rotated by spindle motor 214. The sensed magnetic signals are provided as a continuous, minute analog signal representative of the magnetic data on disk platter 216. This minute analog signal is transferred from read/write head assembly 220 to read channel circuit 202 via preamplifier 204. Preamplifier 204 is operable to amplify the minute analog signals accessed from disk platter 216. In turn, read channel circuit 202 digitizes and decodes the received analog signal, and performs refresh, run, aggregate decoder recovery where data fails to converge to recreate the information originally written to disk platter 216. This data is provided as read data 222 to a receiving circuit. A write operation is substantially the opposite of the preceding read operation with write data 224 being provided to read channel circuit 202. This data is then encoded and written to disk platter 216.

It should be noted that in some embodiments storage system 200 is integrated into a larger storage system such as, for example, a RAID (redundant array of inexpensive disks or redundant array of independent disks) based storage system. Such a RAID storage system increases stability and reliability through redundancy, combining multiple disks as a logical unit. Data can be spread across a number of disks included in the RAID storage system according to a variety of algorithms and accessed by an operating system as if it were a single disk. For example, data can be mirrored to multiple disks in the RAID storage system, or can be sliced and distributed across multiple disks in a number of techniques. If a small number of disks in the RAID storage system fail or become unavailable, error correction techniques can be used to recreate the missing data based on the remaining portions of the data from the other disks in the RAID storage system. The disks in the RAID storage system can be, but are not limited to, individual storage systems such storage system 200, and can be located in close proximity to each other or distributed more widely for increased security. In a write operation, write data is provided to a controller, which stores the write data across the disks, for example by mirroring or by striping the write data. In a read operation, the controller retrieves the data from the disks. The controller then yields the resulting read data as if the RAID storage system were a single disk.

In addition, it should be noted that in some embodiments storage system 200 is modified to include solid state memory that is used to store data in addition to the storage offered by disk platter 216. This solid state memory may be used in parallel to disk platter 216 to provide additional storage. In such a case, the solid state memory receives and provides information directly to read channel circuit 202. Alternatively, the solid state memory may be used as a cache where it offers faster access time than that offered by disk platter 216. In such a case, the solid state memory may be disposed between interface controller 206 and read channel circuit 202 where it operates as a pass through to disk platter 216 when requested data is not available in the solid state memory or when the solid state memory does not have sufficient storage to hold a newly written data set. Based upon the disclosure provided herein, one of ordinary skill in the art will recognize a variety of storage systems including both disk platter 216 and a solid state memory.

Figure 3:
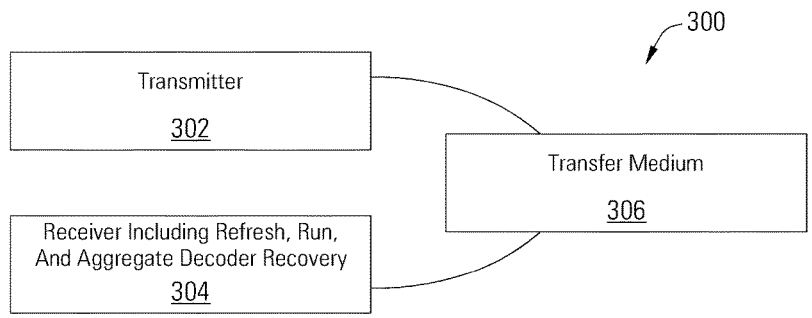
FIG. 3 depicts a magnetic storage system including refresh, run and aggregate decoder recovery in accordance with some embodiments of the present invention.

Turning to FIG. 3, a wireless communication system 300 or data transmission device including a receiver 304 with refresh, run, aggregate decoder recovery is shown in accordance with some embodiments of the present invention. The transmitter 302 is operable to transmit encoded information via a transfer medium 306 as is known in the art. The encoded data is received from transfer medium 306 by receiver 304 where it is decoded. Where data fails to converge in receiver 304, refresh, run, aggregate decoder recovery is performed by receiver 304.

The refresh, run, aggregate decoder recovery refreshes the decoder input to a different state than in a previous decoding run, then re-runs the decoder with the refreshed input. By running from a different initial state, the decoder can avoid trapping sets that caused the previous failure to converge. Several embodiments are disclosed herein for refreshing the decoder input to different states. In some embodiments, the decoder input comprises log likelihood values, which give the probability or likelihood for each value in a set of possible values for a particular bit or symbol that the bit or symbol has that value. The refresh operation in some embodiments alters the log likelihood ratio values in the decoder input, for example by dampening the log likelihood ratio values. A fresh set of decoding iterations are then run based on the refreshed decoder input.

In a message passing decoder, messages are passed back and forth between variable nodes and check nodes, updating the perceived value of variable nodes based on check node calculations, and performing parity check calculations based on the updated variable node values in an iterative manner. With different initial log likelihood ratio values in the decoder input, the variable node updates and check node calculations can arrive at different results and avoid trapping sets. For example, by dampening the log likelihood ratios before re-decoding, the confidence in the data values expressed by the log likelihood ratios is reduced, making it easier for the decoder to change those data values during decoding. This makes it less likely that an incorrect value in a trapping set will be stuck and unchangeable in the decoder because of a high initial confidence value. Furthermore, with a different initial state, trapping sets or local minima may be avoided, improving the probability of landing on the global minima of the cost function associated with the code. For a given initial state, the decoder traverses a specific path on the surface of the cost function, defined by the underlying message-passing algorithm. If one path from the initial state lands on a trapping set, refreshing the decoder input to a different and intelligently selected initial state will help the decoder traverse a different path that avoids the trapping set to converge to the correct codeword, i.e., one of the global minima.

Figure 4:
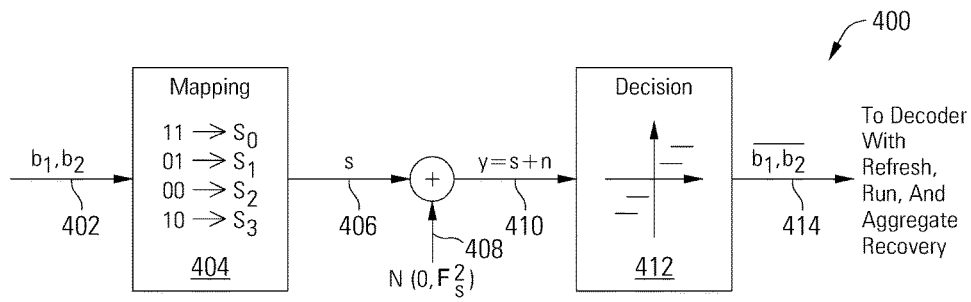
FIG. 4 depicts a model of a flash channel with log likelihood ratio output which can be used with refresh, run and aggregate decoder recovery in accordance with some embodiments of the present invention.

The log likelihood ratios in the decoder input can be obtained in any suitable manner. In some embodiments based on a solid state flash memory, multiple reads with different cell reference voltages can be performed to generate log likelihood ratios. Turning to FIG. 4, a model of a flash channel 400 is depicted in accordance with some embodiments of the present invention. Notably, two-bit inputs with four states are used in this example, although the reference voltage adjustment is not limited to use with any particular bit width or number of states. For two input data bits 402, the two data bits 402 $b_1 b_2$ can be mapped to four possible states in a mapping 404. For example, value '11' for the two data bits 402 can be mapped to state $s_0$, value '01' to state $s_1$, value '00' to state $s_2$, and value '10' to state $s_3$. For a multi-level cell, the cell is programmed to a selected state 406 from the four states depending on the value of the two data bits 402. As voltages representing the selected state 406 are written to and read from the memory cell, noise 408 is added due to the programming process and other inefficiencies and disturbances, yielding a noisy cell voltage 410 y. The noise can be considered to be an additive white Gaussian noise (AWGN), with the noise variances being different depending on the signal transmitted.

The hard decisions of read operations can be converted into soft decisions (log likelihood ratio values) by performing multiple reads with different reference voltages based on the knowledge of the channel. Hard decision states can be divided into a number of soft decision states, and read data from those soft decision states is mapped to log likelihood ratios 414 in decision circuit 412 based on the likelihoods for each soft decision state that a bit in those states is correct.

In some other embodiments based on a magnetic hard drive, log likelihood ratio values can be generated by a soft output data detector such as, but not limited to, a Viterbi algorithm detector. Again, the refresh, run, aggregate decoder recovery is not limited to use in any particular application, and the decoder input can be obtained in any suitable manner and in any format that enables the initial state to be manipulated.

The following definitions apply to some embodiments using a fixed-point message-passing decoder using a variety of min-sum based decoding algorithm. However, refresh, run, aggregate decoder recovery is not limited to this particular application. Let c be a codeword (vector) transmitted over a flash channel or retrieved from another suitable source, r be the vector read out of the flash media or other storage or transmission medium, ĉ be an estimate of the decoder and a codeword but not necessarily c, d̂ be the output of the message-passing decoder after a fixed number of iterations and it need not be a codeword. Let $\Lambda(.)$ be a log-likelihood ratio assignment function defined as follows:
1. $\Lambda(a) = \Lambda(b) \rightarrow$ Log likelihood ratio of each tuple of vector a is assigned point-wise to log likelihood ratio of the corresponding tuple of vector b.
2. $\Lambda(a)\lambda \rightarrow$ Log likelihood ratio of each tuple of vector a is assigned a fixed log likelihood ratio of $\lambda$.
3. $\Lambda(a) = \text{sign}(a)*|\lambda| \rightarrow$ Log likelihood ratio of vector a after assignment preserves sign from before assignment.

Decoder states are defined as follows:
1. Start (or initial) state of a decoder is defined as the log likelihood ratio input to variable nodes of the decoder. Let $\Lambda_{Start}(D)$ be the start state of the decoder.

2. End (or final) state of a decoder is defined as the a posteriori (APP) log likelihood ratio output of the variable nodes of the decoder. Let $\Lambda_{End}(D)$ be the end state of the decoder.

Assume that $\Lambda(r)$ is the log likelihood ratio of the received vector and is the input to the soft decision decoder. Note that $\Lambda(r)$ can be assigned after one or multiple reads of a flash page, or obtained from any other suitable source. After n iterations, limited to some maximum number, the decoder may converge to ĉ or not (yielding d̂). If the decoder has converged then no recovery process is needed. The refresh, run, aggregate decoder recovery is initiated when an instance of $\Lambda(r)$ fails to converge. The recovery process is comprised of the three following steps in some embodiments and the three steps are repeated iteratively until the decoder converges or an exit condition is met. A single round of the recovery process involves a single run of all three steps in some embodiments, where m is the current round.

Refreshing the decoder input involves initializing the decoder to a new and distinct start state. In some embodiments, the decoder input is refreshed according to one or more of the following:

1. $\Lambda_{Start}(D):=\text{sign}(r)*|\lambda|$, where $\lambda$ takes a value from $\{1, 2, 3, 4, 5, \ldots,\}$ and choice of $\lambda$ is distinct for each round of the recovery scheme. [Referred to as Refresh 1.1]
2. $\Lambda_{Start}(D):=\Lambda(r)*\alpha$, where $\alpha$ is a positive scaling factor and takes value less than 1.[Referred to as Refresh 1.2]
3. $\Lambda_{Start}(D):=\Lambda_{End,m-1}(D)*\alpha$, where $\alpha$ is a positive scaling factor and takes a value less than 1. $\Lambda_{End,m-1}(D)$ is the end state of the decoder from the previous round, i.e., m-1. [Referred to as Refresh 1.3]
4. $\Lambda_{Start}(D):=\text{sign}(\Lambda_{End,m-1}(D))*|\lambda|$, where $\lambda$ takes value from $\{1, 2, 3, 4, 5, \ldots,\}$ and choice of $\lambda$ is distinct for each round of the recovery scheme. [Referred to as Refresh 1.4]
5. $\Lambda_{Start}(D):=\Lambda_{Aggregate,m-1}(D)*\alpha$, where $\Lambda_{Aggregate,m-1}(D)$ is a state of the decoder computed by aggregating decoder outputs during one or more previous decoder runs. [Referred to as Refresh 1.5] In various embodiments, different ones of the refresh steps use a different maximum number of iterations as they are applied and/or use a different maximum number of iterations from each other. In a first example, Refresh 1.1 uses a larger maximum number of iterations for smaller values of $\lambda$. In a second example, Refresh 1.2 uses a first maximum number of iterations, and if Refresh 1.3 is used, it uses a second, larger maximum number of iterations.

In Refresh 1.1, the sign of each bit or symbol in the decoder input is retained from the log likelihood ratio vector r read from the storage medium or received from the transmission medium. The magnitude of bits or symbols in the decoder input is replaced by a value $\lambda$ and the decoder is run with the refreshed decoder input. The value $\lambda$ begins at a preselected one of the possible log likelihood ratio values, generally at a value less than the greatest likelihood value. At each failure to converge, the value $\lambda$ is decremented, indicating a lower confidence that the initial value (i.e., the initial sign in a binary decoder, or the initial Galois Field elements in a non-binary decoder) is correct. This lowered confidence makes it easier for the decoder to change values during decoding and take a different path across the cost function. The Refresh 1.1 algorithm can be continued until the $\lambda$ reaches a value below which it cannot be reduced (e.g., 1, to avoid a 0 no confidence log likelihood ratio). The magnitude replacement by $\lambda$ is performed in some embodiments uniformly for all bits or symbols in the decoder input. In other embodiments, the magnitude replacement by $\lambda$ is performed for selected bits or symbols in the decoder input.

In Refresh 1.2, the log likelihood ratios $\Lambda(r)$ of the received vector are scaled by a positive scaling factor $\alpha$ which is a positive scaling factor which takes a value less than 1. The scaling factor is reduced over decoding rounds, dampening the input log likelihood ratio values at the decoder input. The scaling by $\alpha$ is performed in some embodiments uniformly for all bits or symbols in the decoder input. In other embodiments, the scaling by $\alpha$ is performed for selected bits or symbols in the decoder input.

In Refresh 1.3, the dampening of Refresh 1.2 is applied to the end state $\Lambda_{End,m-1}(D)$ of the decoder from the previous round. In some embodiments, the log likelihood ratios in the soft decoder output from the previous decoding iteration are scaled and used as the decoder input. In some embodiments, all bits or symbols in the decoder input are taken from the previous round decoder output and scaled. In some other embodiments, a combination of channel input values and previous round decoder output are used in the decoder input. In some embodiments, only some of the bits or symbols in the decoder input are scaled.

In Refresh 1.4, the sign values sign $(\Lambda_{End,m-1}(D))$ for the bits or symbols in the decoder input are taken from the previous round decoder output, and the magnitude values are replaced by a value $\lambda$ as in Refresh 1.1, where the value of $\lambda$ is distinct for each round of the recovery operation.

In Refresh 1.5, the log likelihood ratios $\Lambda_{Aggregate,m-1}(D)$ used as the decoder input are computed using an aggregation function based on previous round decoder outputs. The computed log likelihood ratios $\Lambda_{Aggregate,m-1}(D)$ are scaled by a positive scaling factor a which is a positive scaling factor which takes a value less than 1, as in Refresh 1.2.

In some embodiments, the decoder input is refreshed using a single one of the refresh algorithms until the decoder converges or until the selected refresh algorithm has been completed without convergence, at which point another refresh algorithm can be selected. For example, if the technique of Refresh 1.1. is selected, replacing log likelihood ratio values at the decoder input by a value $\lambda$, then as long as the decoder fails to converge and the limit on total iterations or total latency has not been reached, decoding iterations will continue based on Refresh 1.1. At the start of each decoding iteration, log likelihood ratio values at the decoder input will be replaced by a different value $\lambda$, with $\lambda$ decreasing at each refresh, until $\lambda$ reaches a value below which it cannot be reduced (e.g., 1). If the decoder has failed to converge while exhausting the choices of start state using Refresh 1.1, then another refresh algorithm is selected, such as Refresh 1.2, 1.3, 1.4 or 1.5.

Each time the decoder input is refreshed, the run phase is initiated. In this phase, the decoder is re-started with input $\Lambda_{Start}(D)$ and run for no more than a fixed number of maximum iterations. If the decoder converges, i.e., $\Lambda_{End}(D)$=ĉ, then an exit condition has been reached and the recovery process is terminated. The decoded output can then be yielded from the decoder, such as, but not limited to, decoder hard decisions. If the decoder fails to converge, then the decoding is terminated after performing the specified maximum iterations with output $\Lambda_{End}(D)$.

In some embodiments, the decoder input is refreshed based on an aggregate of previous decoder outputs. In these embodiments, the soft decoder outputs $\Lambda_{End}(D)$ from the m-th round are stored in an aggregated matrix as shown below:

$$\Lambda^m = [\Lambda_{End}^1(D), \Lambda_{End}^2(D), \Lambda_{End}^3(D), \ldots \Lambda_{End}^m(D)],$$

where each vector is a column vector and forms a matrix of size (code-length x m). From this matrix, a vector $\Lambda_{Aggregate,m}(D)$ is computed by post-processing the aggregate matrix. In some embodiments, the post-processor is implemented as follows:

$$\Lambda_{Aggregate,m} = E([\Lambda_{End}^1(D), \Lambda_{End}^2(D), \Lambda_{End}^3(D), \ldots, \Lambda_{End}^m(D)]),$$

where E(.) is the expectation or averaging function operating across columns, i.e., averages entries along the first row to output expected log likelihood ratios for the first variable node. In some other embodiments, a simple majority-logic approach is taken to computing $\Lambda_{Aggregate,m}(D)$, which may be used in the Refresh step of the next round. Simple majority logic will choose a bit value, say for the first variable node, that a majority of the m runs had reported. Any other aggregation function may be used to compute a vector $\Lambda_{Aggregate,m}(D)$ based on previous decoder outputs. Based upon the disclosure provided herein, one of ordinary skill in the art will recognize a variety of aggregation functions that may be used to calculate vector $\Lambda_{Aggregate,m}(D)$.

In some embodiments, natural exit conditions exist. For example, in Refresh 1.1, the possible values of λ will be exhausted at some point as λ is decremented for each successive decoding round if the decoder fails to converge, and when λ reaches 0, a natural exit condition has been reached. Similarly, Refresh 1.2 will have a limited number of scaling factors α, based on the granularity of α and the highest and lowest value of α. Refresh 1.3 and Refresh 1.4 also have natural exit conditions. The total number of possible maximum iterations in these embodiments is governed by the size of sample sets of λ and α.

Aggregate-based Refresh 1.5 may not have an obvious exit condition in some embodiments. With each decoding run a new $\Lambda_{Aggregate,m}(D)$ is computed and this can be used to initialize the decoder. In some embodiments, the exit condition is defined as a too-small difference between $\Lambda_{Aggregate,m-1}(D)$ from round (m-1) and $\Lambda_{Aggregate,m}(D)$ from round m. In other words, if the difference between the computed aggregate is less than a threshold, the refresh process is terminated. The difference between the two vectors can be determined in any suitable manner, such as, but not limited to, the number of elements in the vector that differ by at least a specified amount.

Finally, the decoder recovery terminates once the decoder converges or in consideration of termination requirements, such as time bounds. According to various embodiments, the termination requirements include one or more of: a maximum number M of allowable rounds is reached; a maximum total number of iterations is used; and a maximum (real-time) latency elapses.

In some embodiments, side information is used in the design, selection and ordering of refresh algorithms. The term "side information" is used herein to refer to knowledge about the low density parity check code or other code structure, the underlying low density parity check code graph, the message-passing decoder, and the decoder progression. The side information can be used, for example, to perform selective scaling or dampening of log likelihood ratios during the refresh process. Side information can include one or more of the following or other pieces of information:

1. Column and row weights of the low density parity check code.
2. Precision or data width of messages at the variable nodes, check nodes, and on the edges.
3. List of unsatisfied checks and neighboring variable nodes at the final iteration of the previous Run step, or a list of variable nodes connected to a certain number of unsatisfied checks.
4. List of all small and disruptive trapping sets–typically, trapping sets involving a small number of variable nodes, such as, but not limited to, 4, 5, 6, or 7, contribute significantly to the error floor.
5. List of dominant trapping sets found by simulation, error and noise injection, or any importance sampling methods.
6. The smallest or largest LLR (whether channel LLR or LDPC output LLR) in a candidate list of LLR based on other side information.
7. Which bits (and their shifts) that are most often involved in harmful/dominant trapping sets or small graph cycles.

Sample sets of λ and α in Refresh step can be effectively populated and ordered with column weight and log likelihood ratio message-width information. For instance, with a 5-bit (4-bit+1 sign bit) fixed-point decoder on a low density parity check graph with column-weight 3, |λ|=5 is used in some embodiments for Refresh 1.1 and Refresh 1.4, and α=⅓ is used in some embodiments for Refresh 1.2 and Refresh 1.3.

When a list of small trapping sets is not available but the list of unsatisfied checks is available, variable nodes connected to larger number of unsatisfied checks are dampened or scaled in some embodiments.

Although storing a list of small trapping sets increases memory cost, a significant cost reduction can be achieved by exploiting symmetries or isomorphisms within the code graph. The knowledge of the unsatisfied checks and neighboring variable nodes can be considered in conjunction with the list of small trapping sets to select a subset of variable nodes that are likely to be in error. These select variable nodes are subjected to aggressive scaling with α and dampening with λ in the Refresh step in some embodiments.

Figure 5:
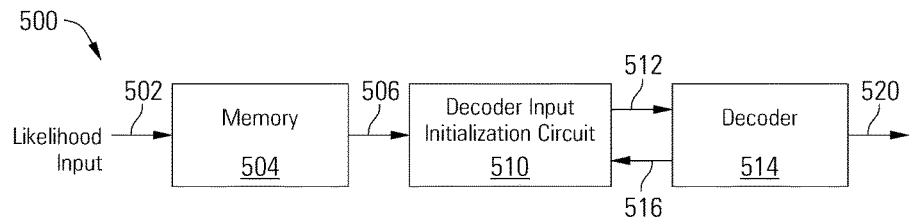
FIG. 5 is a block diagram of a decoding system with a decoder input initialization circuit to refresh decoder input during recovery in accordance with some embodiments of the present invention.

Turning now to FIG. 5, a block diagram of a decoding system 500 with a decoder input initialization circuit 510 to refresh decoder input during recovery is depicted in accordance with some embodiments of the present invention. A likelihood input 502 receives log likelihood ratios Λ (r) for a vector r that is read from flash media or other another storage or transmission medium. The log likelihood ratios Λ (r) from likelihood input 502 are stored in a memory 504, and stored log likelihood ratios Λ (r) 506 are provided to a decoder input initialization circuit 510. The decoder input initialization circuit 510 is operable to refresh the decoder input during decoder recovery, after the log likelihood ratios Λ (r) from likelihood input 502 for vector r have failed to converge in the decoder 514. The decoder input initialization circuit 510 is operable in various embodiments to apply one or more of refresh algorithms Refresh 1.1, Refresh 1.2, Refresh 1.3 and/or Refresh 1.4. The decoder input initialization circuit 510 provides refreshed decoder input 512 to decoder 514 and initiates a decoder run in decoder 514. The decoder input initialization circuit 510 can include any suitable circuitry to implement one or more of refresh algorithms Refresh 1.1, Refresh 1.2, Refresh 1.3 and/or Refresh 1.4, such as, but not limited to, counters or registers to maintain values of λ and/or α, multiplexers or other selection or combination circuits to replace log likelihood ratios, multipliers to apply scaling factors, etc. Based upon the disclosure provided herein, one of ordinary skill in the art will recognize a variety of circuitry that may be included as part of decoder input initialization circuit 510 to implement one or more of refresh algorithms Refresh 1.1, Refresh 1.2, Refresh 1.3 and/or Refresh 1.4.

Where the decoder 514 fails to converge on the refreshed decoder input 512, the decoder input initialization circuit 510 again refreshes the decoder input 512, staying within the same refresh scheme in some embodiments until it is exhausted before moving to another refresh scheme. In some refresh schemes, decoder input initialization circuit 510 computes refreshed decoder input 512 based on the decoder state 516 from the previous run, such as the log likelihood ratio values resulting from the decoder run. Where the refreshed decoder input 512 converges in decoder 514, the recovery operation is complete and hard decisions 520 or other suitable output is provided by decoder 514.

Decoder 514 can be any suitable message-passing decoder, such as, but not limited to, a low density parity check decoder.

Figure 6:
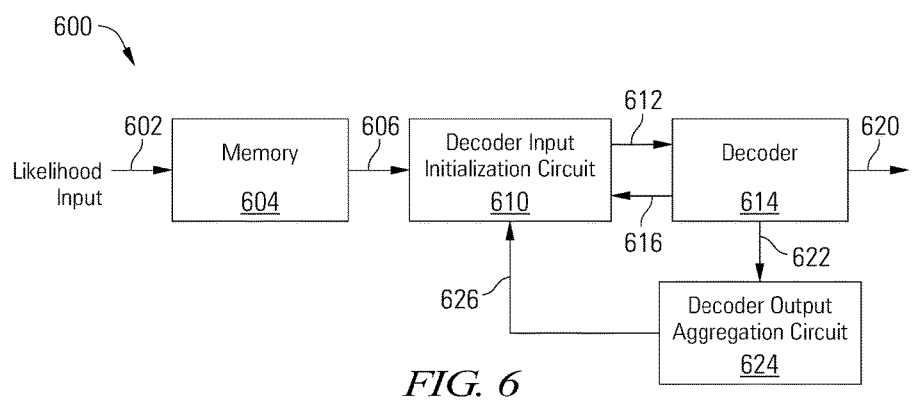
FIG. 6 is a block diagram of a decoding system with a decoder output aggregation circuit to aggregate recovery results and a decoder input initialization circuit to refresh decoder input based on aggregated recovery results in accordance with some embodiments of the present invention.

Turning now to FIG. 6, a block diagram of a decoding system 600 with a decoder output aggregation circuit 624 to aggregate recovery results and a decoder input initialization circuit 610 to refresh decoder input based on aggregated recovery results is depicted in accordance with some embodiments of the present invention. A likelihood input 602 receives log likelihood ratios Λ (r) for a vector r that is read from flash media or other another storage or transmission medium. The log likelihood ratios Λ (r) from likelihood input 602 are stored in a memory 604, and stored log likelihood ratios Λ (r) 606 are provided to a decoder input initialization circuit 610. The decoder output aggregation circuit 624 is operable to aggregate the soft decoder outputs $\Lambda_{End}(D)$ 622 from previous decoding rounds, yielding an aggregate vector $\Lambda_{Aggregate,m}(D)$ 626 based on the aggregated soft decoder outputs $\Lambda_{End}(D)$ 622.

The decoder input initialization circuit 610 is operable to refresh the decoder input during decoder recovery, after the log likelihood ratios Λ (r) from likelihood input 602 for vector r, or after previous refreshed decoder input 612 have failed to converge in the decoder 614. The decoder input initialization circuit 610 is operable in various embodiments to apply refresh algorithm Refresh 1.5 based on aggregate vector $\Lambda_{Aggregate,m}(D)$ 626. The decoder input initialization circuit 610 provides refreshed decoder input 612 to decoder 614 and initiates a decoder run in decoder 614.

Where the decoder 614 fails to converge on the refreshed decoder input 612, the soft decoder outputs $\Lambda_{End}(D)$ 622 is provided to decoder output aggregation circuit 624 and a new aggregate vector $\Lambda_{Aggregate,m}(D)$ 626 is computed. The decoder input initialization circuit 610 again refreshes the decoder input 612 and triggers another decoder run, until the decoder 614 converges or an exit condition is reached. Where the refreshed decoder input 612 converges in decoder 614, the recovery operation is complete and hard decisions 620 or other suitable output is provided by decoder 614.

In some embodiments, decoder input initialization circuit 610 also implements one or more of refresh algorithms Refresh 1.1, Refresh 1.2, Refresh 1.3, and/or Refresh 1.4, with decoder output aggregation circuit 624 aggregating some or all of the results for use in a later refresh algorithm Refresh 1.5.

The decoder input initialization circuit 610 can include any suitable circuitry to implement one or more of refresh algorithms Refresh 1.1, Refresh 1.2, Refresh 1.3, Refresh 1.4 and/or Refresh 1.5, such as, but not limited to, counters or registers to maintain values of λ and/or a, multiplexers or other selection or combination circuits to replace log likelihood ratios, multipliers to apply scaling factors, etc. Based upon the disclosure provided herein, one of ordinary skill in the art will recognize a variety of circuitry that may be included as part of decoder input initialization circuit 610 to implement one or more of refresh algorithms Refresh 1.1, Refresh 1.2, Refresh 1.3, Refresh 1.4 and/or Refresh 1.5. The decoder output aggregation circuit 624 can include any suitable circuitry to aggregate soft decoder outputs $\Lambda_{End}(D)$ 622 and from these, to compute an aggregate vector $\Lambda_{Aggregate,m}(D)$ 626, such as, but not limited to, a buffer or memory and average calculation circuit or comparators and selection circuits.

Figure 7:
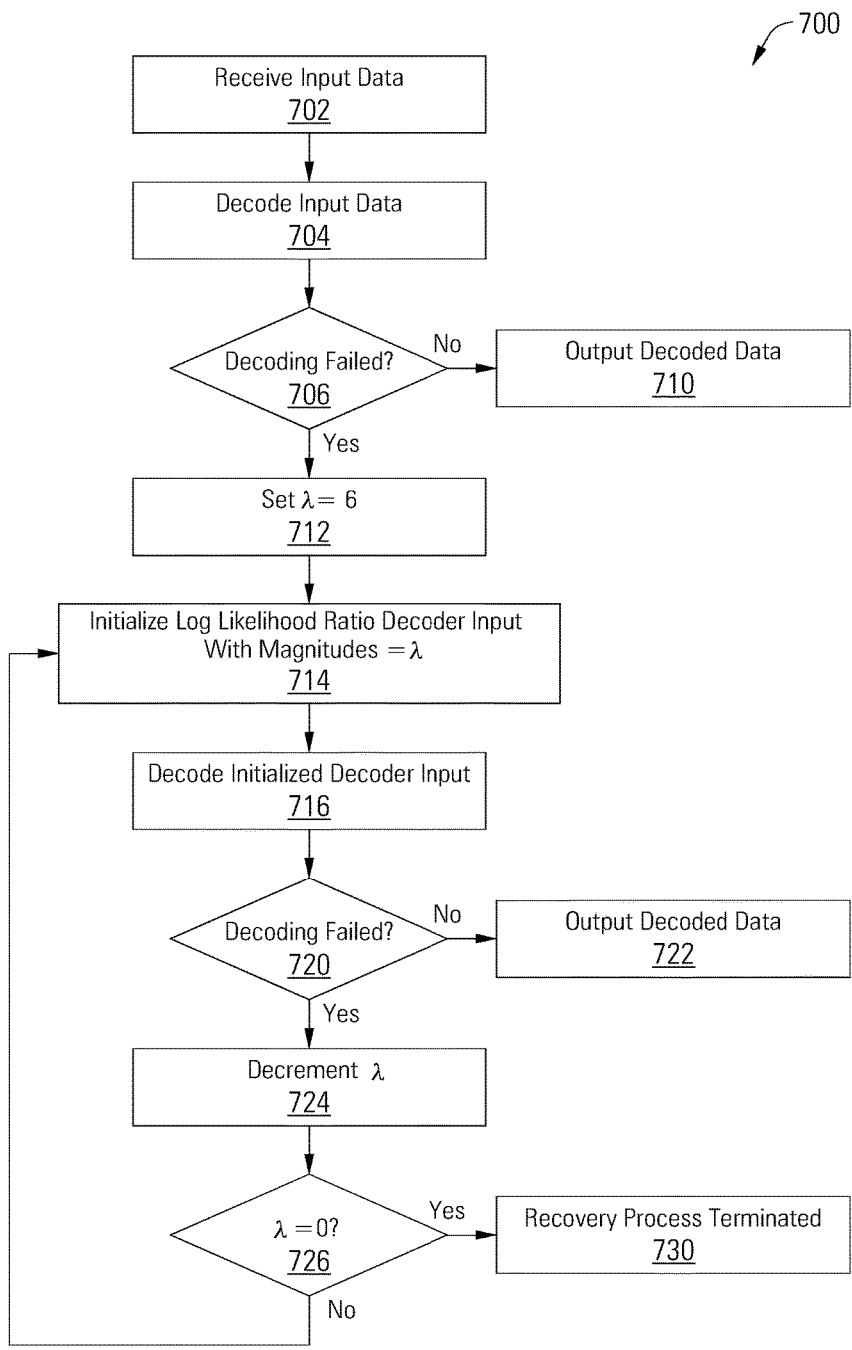
FIG. 7 is a flow diagram showing a method for refreshing decoder input by log likelihood ratio replacement during recovery in accordance with some embodiments of the present invention.

Turning to FIG. 7, a flow diagram 700 shows a method for refreshing decoder input by log likelihood ratio replacement during recovery in accordance with some embodiments of the present invention. In various embodiments of the method of flow diagram 700, Refresh 1.1 and Refresh 1.4 are implemented.

Following flow diagram 700, input data is received. (Block 702) The input data can comprise log likelihood ratios Λ (r) for a vector r that is read from flash media or other another storage or transmission medium. Based upon the disclosure provided herein, one of ordinary skill in the art will recognize a variety of sources of the input data. The input data is decoded. (Block 704) The input data can be decoded using any message-passing decoding algorithm, such as, but not limited to, a low density parity check decoding algorithm. If the decoding succeeded or converged (Block 706), the decoded data is output. (Block 710) If, however, the decoding failed (Block 706), a recovery process is implemented.

A log likelihood ratio replacement value λ is initialized at a start value. (Block 712) The start value of the log likelihood ratio replacement value λ can be any suitable value selected from among the possible likelihood values, generally something less than the highest likelihood. The log likelihood ratio decoder input is initialized based on log likelihood ratio replacement value λ. (Block 714) In some embodiments, implementing Refresh 1.1, the sign values used in the initialized decoder input are obtained from the log likelihood ratios Λ (r) for channel vector r. In some embodiments, implementing Refresh 1.4, the sign values used in the initialized decoder input are obtained from the log likelihood ratios $\Lambda_{End}(D)$ in the end state or soft decoder output of a previous run of the decoder. Notably, in some cases, the log likelihood ratios $\Lambda_{End}(D)$ not include the parity bits. In these cases, the sign values used for parity bits in the initialized decoder input are derived from the log likelihood ratios Λ (r) for channel vector r, while the sign values used for user data bits in the initialized decoder input are derived from the log likelihood ratios $\Lambda_{End}(D)$ in the end state or soft decoder output of a previous run of the decoder.

The initialized decoder input is decoded. (Block 716) Again, any message-passing decoder algorithm can be applied, such as, but not limited to, a min-sum based low density parity check decoding algorithm. If the decoding of the initialized decoder input succeeded or converged (Block 720), the decoded data is output. (Block 722) If, however, the decoding failed (Block 720), the recovery process continues. The log likelihood ratio replacement value λ is decremented. (Block 724) If the log likelihood ratio replacement value λ is 0(Block 726), this particular Refresh scheme has been exhausted and the recovery process is terminated.

(Block 730) If the likelihood ratio replacement value λ is greater than 0(Block 726), the recovery process continues at Block 714.

In some embodiments, after the log likelihood ratio replacement value λ reaches 0, non-linear or non-uniform dampening is performed. Non-linear dampening is an instance of selective dampening based on side information about the symmetries or isomorphisms in the low density parity check code graph. In some embodiments, for example, nodes within a circulant of a low density parity check matrix follow a log likelihood ratio profile and this profile is preserved across all circulants in the code. The log likelihood ratio profile is generated by uniform random dampening. In some other embodiments, nodes within a circulant are dampened by the same amount that is randomly selected, with a different dampening factor selected for each circulant.

In some embodiments, the method for refreshing decoder input during recovery of flow diagram 700 is modified to perform selective dampening with side information. It is assumed that lists of variable nodes connected to unsatisfied parity check nodes are available from the previous run of the decoder, with a separate lists for variable nodes connected to 1 unsatisfied parity check node and for variable nodes connected to 2 unsatisfied parity check nodes. The log likelihood ratios for the variable nodes connected to 2 unsatisfied parity check nodes are dampened more aggressively than log likelihood ratios for the variable nodes connected to 1 unsatisfied parity check node. Other log likelihood ratios are left undampened.

Figure 8:
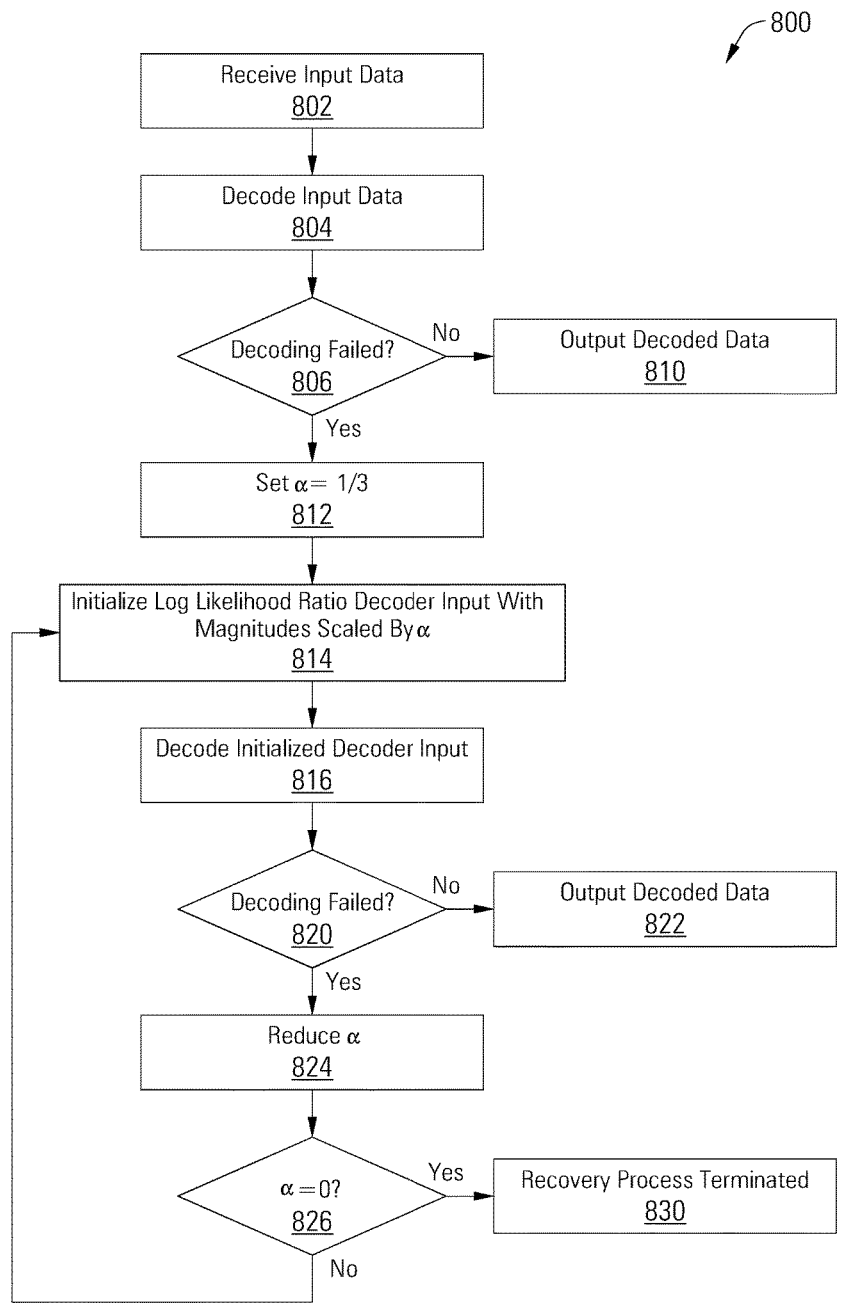
FIG. 8 is a flow diagram showing a method for refreshing decoder input by log likelihood ratio scaling during recovery in accordance with some embodiments of the present invention.

Turning to FIG. 8, a flow diagram 800 shows a method for refreshing decoder input by log likelihood ratio scaling during recovery in accordance with some embodiments of the present invention. In various embodiments of the method of flow diagram 800, Refresh 1.2 and Refresh 1.3 are implemented.

Following flow diagram 800, input data is received. (Block 802) The input data can comprise log likelihood ratios Λ (r) for a vector r that is read from flash media or other another storage or transmission medium. Based upon the disclosure provided herein, one of ordinary skill in the art will recognize a variety of sources of the input data. The input data is decoded. (Block 804) The input data can be decoded using any message-passing decoding algorithm, such as, but not limited to, a low density parity check decoding algorithm. If the decoding succeeded or converged (Block 806), the decoded data is output. (Block 810) If, however, the decoding failed (Block 806), a recovery process is implemented.

A log likelihood ratio scaling value α is initialized at a start value. (Block 812) The start value of the log likelihood ratio scaling value α is a positive scaling factor and takes a value less than 1, such as, but not limited to, ⅓. The log likelihood ratio decoder input is initialized based on log likelihood ratio scaling value α. (Block 814) The initial log likelihood ratio values are scaled by scaling value α. In some embodiments, implementing Refresh 1.2, the sign values and initial log likelihood ratio values used in the initialized decoder input are obtained from the log likelihood ratios Λ (r) for channel vector r. In some embodiments, implementing Refresh 1.3, the sign values and initial log likelihood ratio values used in the initialized decoder input are obtained from the log likelihood ratios $\Lambda_{End}(D)$ the end state or soft decoder output of a previous run of the decoder. Notably, in some cases, the log likelihood ratios $\Lambda_{End}(D)$ do not include the parity bits. In these cases, the sign values used for parity bits in the initialized decoder input are derived from the log likelihood ratios Λ (r) for channel vector r, while the sign values used for user data bits in the initialized decoder input are derived from the log likelihood ratios $\Lambda_{End}(D)$ the end state or soft decoder output of a previous run of the decoder.

The initialized decoder input is decoded. (Block 816) Again, any message-passing decoder algorithm can be applied, such as, but not limited to, a min-sum based low density parity check decoding algorithm. If the decoding of the initialized decoder input succeeded or converged (Block 820), the decoded data is output. (Block 822) If, however, the decoding failed (Block 820), the recovery process continues. The log likelihood ratio scaling value α is reduced. (Block 824) In some embodiments, the scaling value α is reduced by a predetermined, fixed amount, for example by subtracting a fixed fraction from the previous value of the scaling value α. If the log likelihood ratio scaling value α is 0 (Block 826), this particular Refresh scheme has been exhausted and the recovery process is terminated. (Block 830) If the likelihood ratio scaling value α is greater than 0(Block 826), the recovery process continues at Block 814.

Figure 9:
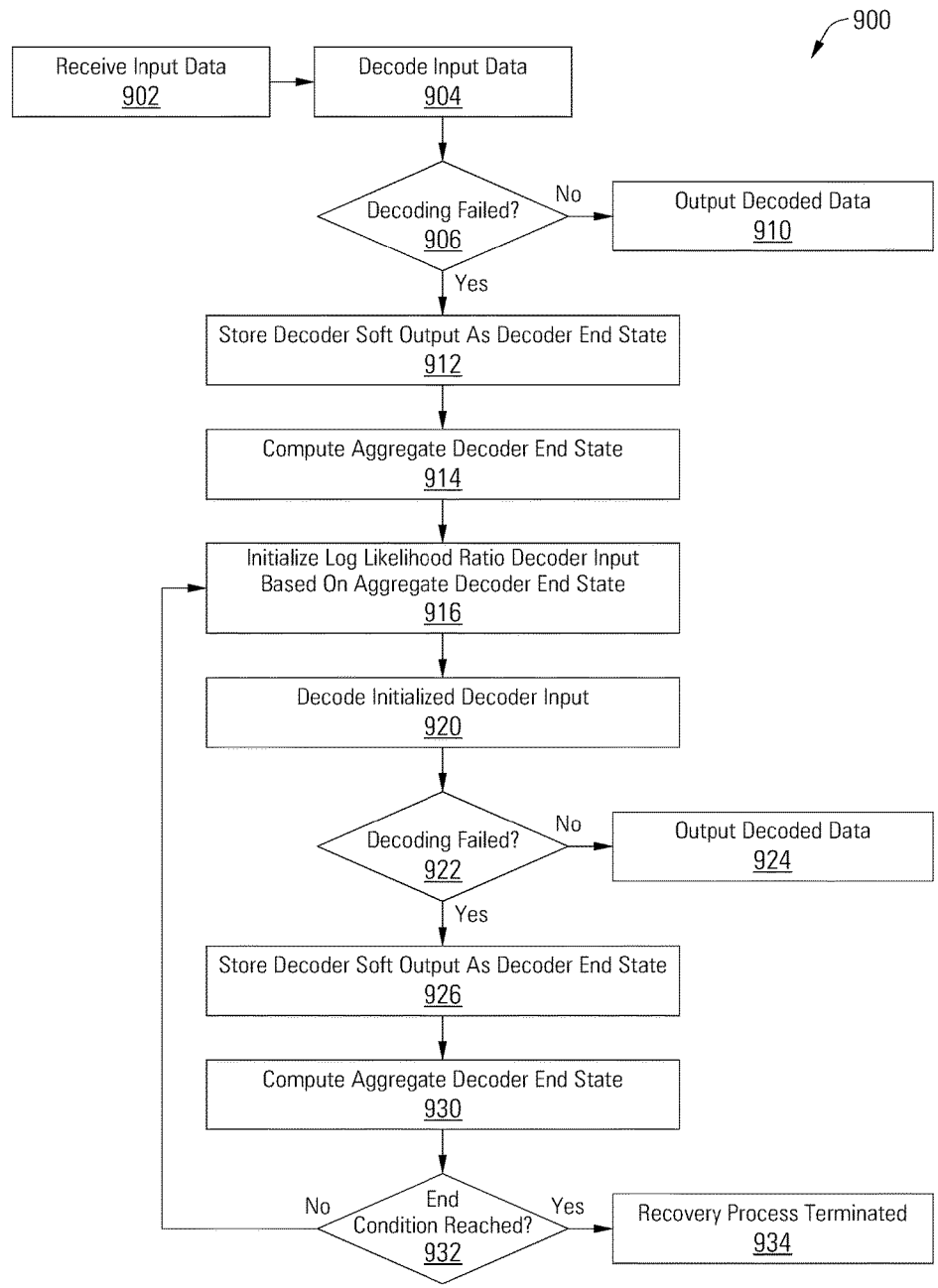
FIG. 9 is a flow diagram showing a method for aggregating decoder output and refreshing decoder input during recovery in accordance with some embodiments of the present invention.

Turning to FIG. 9, a flow diagram 900 shows a method for aggregating decoder output and refreshing decoder input according to Refresh 1.5 during recovery in accordance with some embodiments of the present invention. Following flow diagram 900, input data is received. (Block 902) The input data can comprise log likelihood ratios Λ (r) for a vector r that is read from flash media or other another storage or transmission medium. Based upon the disclosure provided herein, one of ordinary skill in the art will recognize a variety of sources of the input data. The input data is decoded. (Block 904) The input data can be decoded using any message-passing decoding algorithm, such as, but not limited to, a low density parity check decoding algorithm. If the decoding succeeded or converged (Block 906), the decoded data is output. (Block 910) If, however, the decoding failed (Block 906), a recovery process is implemented.

The decoder soft output is stored as the decoder end state. (Block 912) An aggregate decoder end state is calculated. (Block 914) The aggregate decoder end state $\Lambda_{Aggregate,m}(D)$, is calculated in some embodiments using an averaging function operating across columns, i.e., averaging entries along the first row of the parity check matrix to output expected log likelihood ratios for the first variable node. In some other embodiments, a simple majority-logic approach is taken to computing the aggregate decoder end state by choosing a bit value, say for the first variable node, that a majority of the m runs had reported. Any other aggregation function may be used to compute the aggregate decoder end state based on previous decoder outputs.

The log likelihood ratio decoder input is initialized based on the aggregate decoder end state. (Block 916) The log likelihood ratio decoder input can be derived from the aggregate decoder end state in any suitable fashion, for example using the aggregate decoder end state as the initial value and performing log likelihood ratio replacement or scaling according to Refresh 1.1, Refresh 1.2, Refresh 1.3 or Refresh 1.4.

The initialized decoder input is decoded. (Block 920) Again, any message-passing decoder algorithm can be applied, such as, but not limited to, a min-sum based low density parity check decoding algorithm. If the decoding of the initialized decoder input succeeded or converged (Block 922), the decoded data is output. (Block 924) If, however, the decoding failed (Block 922), the recovery process continues. The decoder soft output is stored as the decoder end state. (Block 926) An aggregate decoder end state is calculated. (Block 930) It is determined whether an end condition has been reached. (Block 932) For example, if the change in the aggregate decoder end state was less than a threshold value, the end condition can be determined to have been reached. If the end condition has been reached (Block 932), the recovery process is terminated. (Block 934) Otherwise, the recovery process continues at Block 916.

Figure 10:
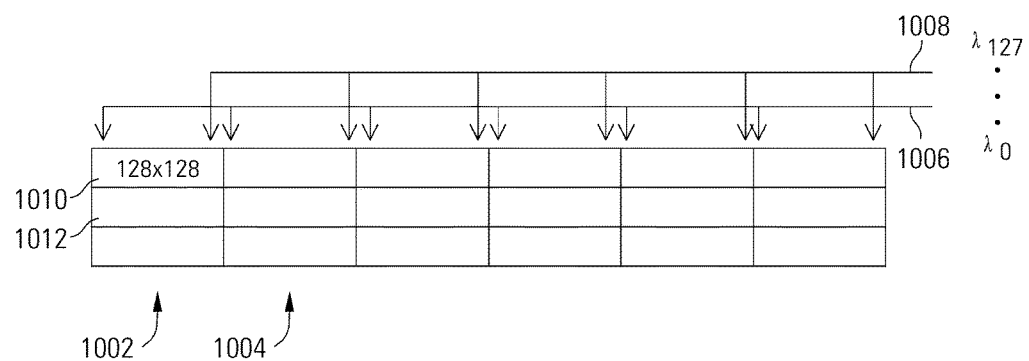
FIG. 10 is a diagram showing the mapping of log likelihood ratio replacement values for non-linear dampening in a quasi-circulant low density parity check decoder to refresh decoder input during recovery in accordance with some embodiments of the present invention.

Turning to FIG. 10, a mapping of log likelihood ratio replacement values for non-linear dampening in a quasi-circulant low density parity check decoder is depicted in accordance with some embodiments of the present invention. The non-linear dampening is initiated in some embodiments after another recovery scheme has failed to converge, such as after block 730 of FIG. 7 or block 830 of FIG. 8. Non-linear dampening is an instance of the selective dampening with side information about the symmetries or isomorphisms in the low density parity check code graph, for instance using topological enumeration of the number of trapping sets at each circulant column, or an enumeration of the number of 6 and 8 cycles. A Monte Carlo simulation can also be used to find trapping set asymmetries among column circulants that can be used for this purpose. In some embodiments, as shown in FIG. 10, the non-linear dampening includes refreshing the decoder input by replacing log likelihood ratio magnitudes where nodes within a circulant follow a log likelihood ratio profile and this profile is preserved across all circulants in the code. The log likelihood ratio profile is generated by uniform random dampening. This is illustrated in FIG. 10, which shows a matrix of circulants in the code arranged in columns (e.g., 1002, 1004). Each bit in a circulant is dampened by replacing the log likelihood ratio magnitude by a particular log likelihood ratio replacement value $\lambda_i$, where i is the index of the replacement value. Given circulants that are 128 bits wide, i ranges from 0 to 127. Each circulant (e.g., 1010, 1012) in a column (e.g., 1002) is dampened the same way, and the same dampening is repeated for each column (e.g., 1002, 1004) of circulants.

Figure 11:
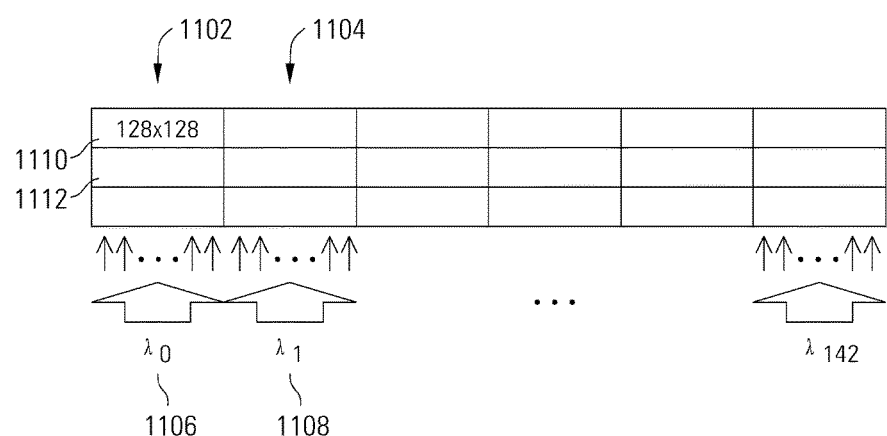
FIG. 11 is a diagram showing another mapping of log likelihood ratio replacement values for non-linear dampening in a quasi-circulant low density parity check decoder to refresh decoder input during recovery in accordance with some embodiments of the present invention.

Turning to FIG. 11, another mapping of log likelihood ratio replacement values for non-linear dampening in a quasi-circulant low density parity check decoder is depicted in accordance with some embodiments of the present invention. In this embodiment, nodes within a circulant are dampened by the same amount that is randomly selected. For example, every bit of each circulant (e.g., 1110, 1112) in a column (e.g., 1102) is dampened using the same log likelihood ratio replacement value $\lambda_0$ 1106, every bit of each circulant in another column (e.g., 1104) is dampened using the same log likelihood ratio replacement value $\lambda_1$ 1108, and so on. Given a code with 143 columns of circulants, there will be 143 dampening values or factors. Each of the dampening values can have different values, or in some embodiments, there may be some of the dampening factors can have the same value.

Figure 12:
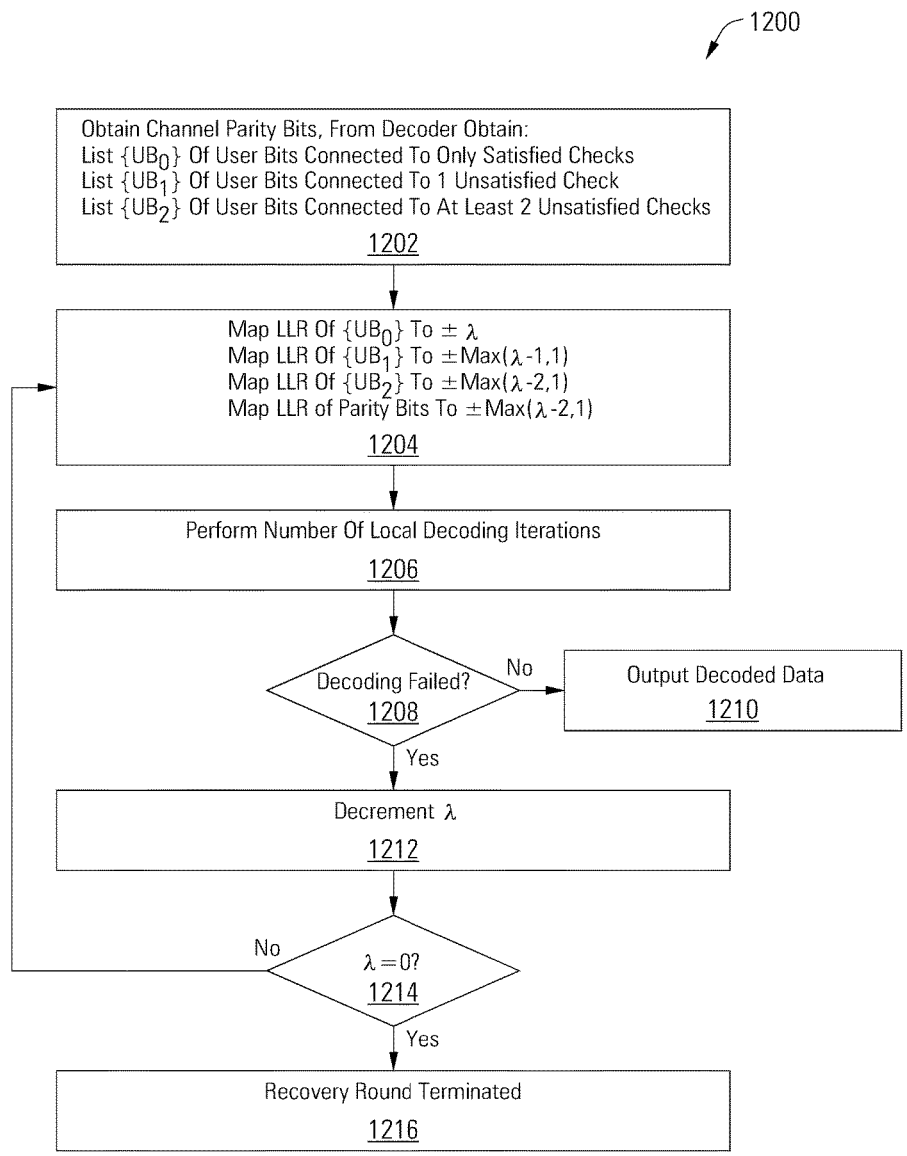
FIG. 12 is a flow diagram showing a method for refreshing decoder input by log likelihood ratio replacement using non-linear dampening during recovery in accordance with some embodiments of the present invention.

Turning to FIG. 12, a flow diagram 1200 shows a method for refreshing a decoder input by log likelihood ratio replacement using non-linear dampening during recovery in accordance with some embodiments of the present invention. In this embodiment, the decoder input is refreshed based on side information, including an indication by the decoder from a previous decoding run as to which parity checks are satisfied, and specifically the number of unsatisfied checks connected to each variable node or bit. The non-linear dampening can be initiated in some embodiments after another failed decoding or after a recovery scheme has failed to converge, such as after block 730 of FIG. 7 or block 830 of FIG. 8. Following flow diagram 1200, the parity bits and user data bits are obtained for dampening. (Block 1202) In some embodiments, the decoder does not provide parity bits, in which case the channel parity bits are used. A list $\{UB_0\}$ of the variable nodes connected only to check nodes with satisfied parity checks is obtained, a list $\{UB_1\}$ of the variable nodes connected only one check node with an unsatisfied parity check is obtained, and a list $\{UB_2\}$ of the variable nodes connected to at least two check nodes with unsatisfied parity checks is obtained.

The log likelihood ratio magnitudes of the bits in $\{UB_0\}$ are mapped to $\pm\lambda$, where $\lambda$ is a dampening value or factor that is initialized at a particular value, such as, but not limited to, 6. The signs of the bits that determine the ±state or polarity of the log likelihood ratios are taken in some embodiments from the initial channel values, and in some other embodiments from the decoder output from a previous decoding. The log likelihood ratio magnitudes of the bits in $\{UB_1\}$ are mapped to $\pm Max(\lambda-1,1)$, or in other words, to $\pm(\lambda-1)$ or 1, whichever is greater. The log likelihood ratio magnitudes of the bits in $\{UB_2\}$ are mapped to $\pm Max(\lambda-2, 1)$, or in other words, to $\pm(\lambda-2)$ or 1, whichever is greater. The log likelihood ratio magnitudes of the parity bits are also mapped to $\pm Max(\lambda-2,1)$. (Block 1204)

A number of local decoding iterations are performed, such as, but not limited to 100 iterations. (Block 1206) At each iteration, a determination is made as to whether the data converged. (Block 1208) If the data converged, the decoded data is output. (Block 1210) If, however, the decoding failed (Block 1208), the recovery process continues. The log likelihood ratio replacement value $\lambda$ is decremented. (Block 1212) If the log likelihood ratio replacement value $\lambda$ is 0 (Block 1214), this particular recovery scheme has been exhausted and the recovery process is terminated. (Block 1216) If the likelihood ratio replacement value $\lambda$ is greater than 0 (Block 1214), the recovery process continues at Block 1204.

It should be noted that the various blocks shown in the drawings and discussed herein can be implemented in integrated circuits along with other functionality. Such integrated circuits can include all of the functions of a given block, system or circuit, or a subset of the block, system or circuit. Further, elements of the blocks, systems or circuits can be implemented across multiple integrated circuits. Such integrated circuits can be any type of integrated circuit known in the art including, but are not limited to, a monolithic integrated circuit, a flip chip integrated circuit, a multichip module integrated circuit, and/or a mixed signal integrated circuit. It should also be noted that various functions of the blocks, systems or circuits discussed herein can be implemented in either software or firmware. In some such cases, the entire system, block or circuit can be implemented using its software or firmware equivalent. In other cases, the one part of a given system, block or circuit can be implemented in software or firmware, while other parts are implemented in hardware.

In conclusion, the present invention provides novel systems and methods for refresh, run, aggregate decoder recovery. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. A data processing system comprising:
   a memory;
   a data input of the memory to receive encoded data, the encoded data comprising a log likelihood ratio input;
   a decoder operable to apply a decoding algorithm to likelihood values for the received encoded data and to yield a decoded output when the likelihood values for the received encoded data fail to converge in the decoder; and
   when one or more likelihood values for the received encoded data fail to converge in the decoder, a decoder input initialization circuit operable to:
   generate new decoder input values based at least in part on the likelihood values for the received encoded data, wherein sign values used for parity bits in the new decoder input values are derived from sign values of the log likelihood ratio input of the received encoded data, and sign values used for data bits in the new decoder input values are derived from a log likelihood ratio value resulting from the decoder applying the decoding algorithm to the likelihood values for the received encoded data;
   replace magnitudes of at least some of the likelihood values for the received encoded data with fixed values based on one of the one or more generated new decoder input values; and
   reduce the fixed values each time a decoding run fails to converge.

2. The data processing system of claim 1, wherein the decoder comprises a message-passing decoder.

3. The data processing system of claim 1, wherein the decoder comprises a low density parity check decoder.

4. The data processing system of claim 1, wherein the magnitudes of all of the likelihood values for the received encoded data are replaced with the fixed value.

5. The data processing system of claim 1, wherein the decoder input initialization circuit is operable to scale magnitudes of at least some of the likelihood values for the received encoded data by a scaling factor to generate the new decoder input values.

6. The data processing system of claim 1, wherein the decoder input initialization circuit is operable to generate the new decoder input values based in part on the decoded output from a previous decoding run.

7. A method for processing data, comprising:
   receiving log likelihood ratio values for encoded data at a data input of a memory of a decoder of a storage device or a data transmission device;
   applying, by the decoder, a decoding algorithm to the log likelihood ratio values;
   when the decoding algorithm fails to converge, generating, by the decoder, new log likelihood ratio values based at least in part on the log likelihood ratio values for the encoded data, wherein signs used for parity bits in the new log likelihood ratio values are derived from signs of the log likelihood ratio values for the encoded data, and sign values used for data bits in the new log likelihood ratio values are derived from a log likelihood ratio value resulting from applying the decoding algorithm to the log likelihood ratio values for the encoded data, and wherein magnitudes of the new log likelihood ratio values comprise fixed values that are reduced with each successive decoding run; and
   reapplying, by the decoder, the decoding algorithm to the new log likelihood ratio values.

8. The method of claim 7, further comprising performing dampening when reapplying the decoding algorithm to the new log likelihood ratio values fails to converge, wherein the dampening comprises replacing the magnitudes of the new log likelihood ratio values based on a number of unsatisfied checks for each variable node in a previous decoding run.

* * * * *